United States Patent
Assaf et al.

(10) Patent No.: US 12,361,195 B1
(45) Date of Patent: Jul. 15, 2025

(54) EXTENDING COVER PROPERTIES IN FORMAL VERIFICATION TO GENERATE FAILURE TRACES THAT REACH END-OF-TEST

(71) Applicant: Amazon Technologies, Inc., Seattle, WA (US)

(72) Inventors: Hani Assaf, Haifa (IL); Max Chvalevsky, Mevaseret Zion (IL); Uri Leder, Lotem (IL); Yefim Fainstein, Petah Tikva (IL)

(73) Assignee: Amazon Technologies, Inc., Seattle, WA (US)

( * ) Notice: Subject to any disclaimer, the term of this patent is extended or adjusted under 35 U.S.C. 154(b) by 783 days.

(21) Appl. No.: 17/548,259

(22) Filed: Dec. 10, 2021

(51) Int. Cl.
*G06F 30/398* (2020.01)

(52) U.S. Cl.
CPC .................. *G06F 30/398* (2020.01)

(58) Field of Classification Search
CPC ...................................................... G06F 30/398
See application file for complete search history.

(56) References Cited

U.S. PATENT DOCUMENTS

| 8,863,049 B1 | 10/2014 | Lundgren et al. |
| 10,289,798 B1 | 5/2019 | Nunes Barcelos et al. |
| 10,331,831 B2 | 6/2019 | Darbari et al. |
| 2021/0165942 A1 | 6/2021 | Darbari et al. |

*Primary Examiner* — Jack Chiang
*Assistant Examiner* — Aric Lin
(74) *Attorney, Agent, or Firm* — S. Scott Foster; Kowert, Hood, Munyon, Rankin & Goetzel, P.C.

(57) ABSTRACT

Cover properties are extended in formal verification to reach an effective end-of-test stage for a design under test. A formal verification task for a design under test may be received at a verification system. A cover property asserted in the formal verification task may be identified. An additional condition may be implemented for the identified cover property to extend the identified cover property to cause performance of the formal verification task to generate a trace to reach an effective end-of-test stage for the design under test in the event of a failure of the cover property.

20 Claims, 8 Drawing Sheets

EXTENDING COVER PROPERTIES IN FORMAL VERIFICATION TO GENERATE FAILURE TRACES THAT REACH END-OF-TEST

BACKGROUND

Formal verification provides a cost effective design tool when implementing different hardware solutions. A formal verification system may generate a mathematical model or representation of a hardware design, then determine whether a proof exists or can be generated that solves the mathematical model (e.g., by providing a proof to demonstrate correctness of a finite state machine). If a proof exists, then it can be assured that the hardware design is logically sound (although further testing for physical implementation features, such as component layout to account for On-Chip Variation and other physically occurring conditions may still be performed). In this way, problems in the hardware design can be identified.

Figure 1:
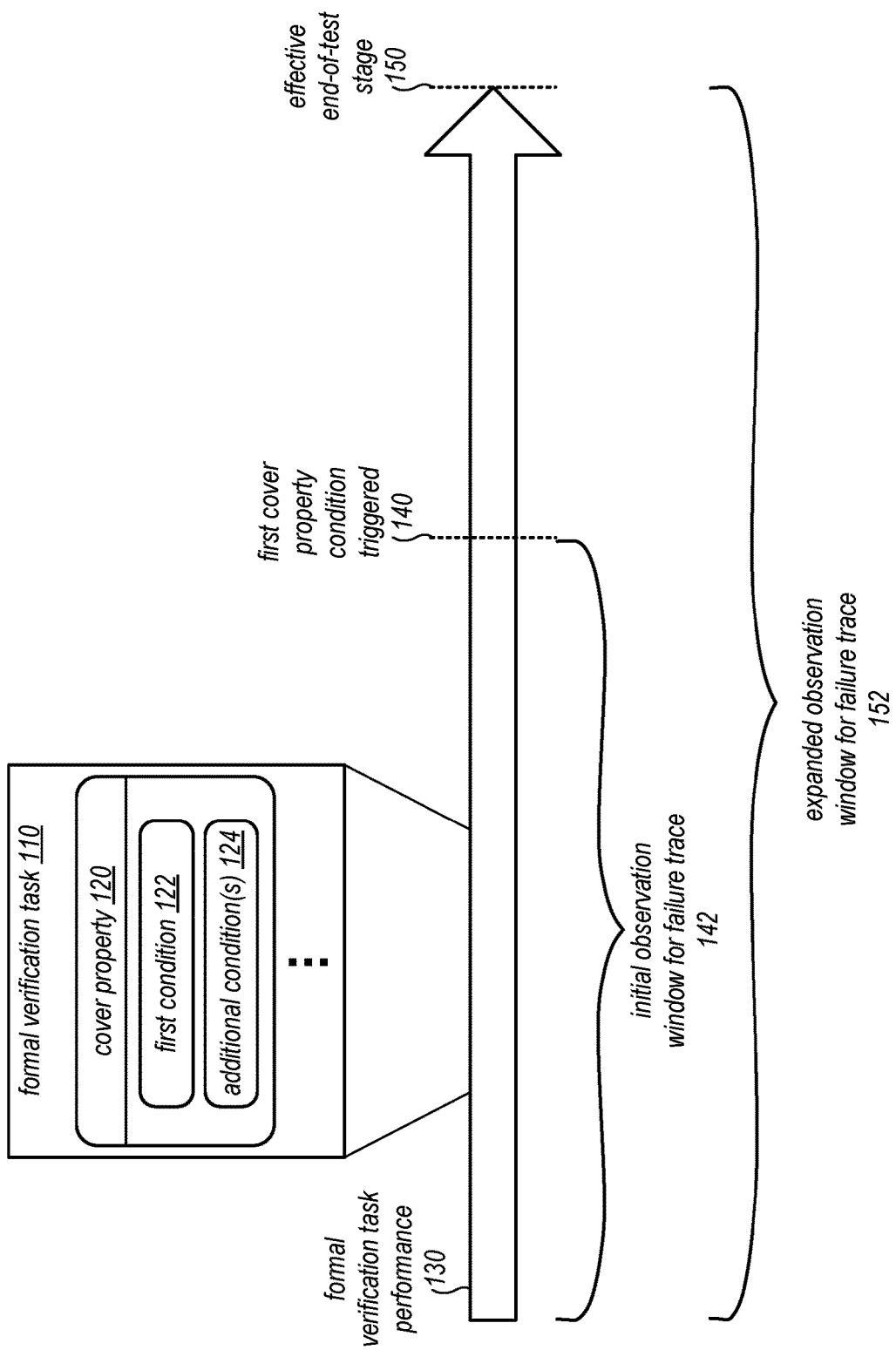
FIG. 1 illustrates a logical block diagram of extending cover properties in formal verification to generate failure traces that reach end-of-test, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various techniques of extending cover properties in formal verification to generate failure traces that reach end-of-test are described herein. Formal verification techniques offer cost effective verification when designing new hardware, such as integrated circuits. Techniques that can increase the utilization of formal verification systems may reduce design and development costs, decrease the number of undetected bugs, errors, or design flaws, and thus such techniques may be highly desirable. For example, formal verification can be used to prove the correctness of small hardware designs and for larger designs find bugs or partial indications of correctness.

For example, coverage is used in formal verification in order to make sure that the verification environment is not over-constrained and to assist in understanding the design under test functionality. An over-constrained environment limits design behavior in a way that can prevent some functionality from being expressed. For example, such environments can lead to missing bugs that might be caused by triggering this functionality, such as making an assumption that a full First In First Out (FIFO) component is not being written to, prevents verification of built-in overflow protection of the FIFO component.

Whenever formal verification does not converge (e.g., does not reach a proof), coverage can also be used to discover bugs in designs. For example, cover properties can be used to generate traces for failures of a design in order to cover events that are being generated and properties that can be checked along these traces. While this technique can be effective, generated traces end as soon as the cover property condition is triggered. While this effect provides control of a functionality, in practice it limits the observability of bugs that caused a failure of the design. For example, a cover property of a write attempt to a full FIFO component would lead to a potential overflow, but the data would not become corrupted until a later cycle or a few cycles later, such that the corruption can be detected only long after the occurrence of the cause when the corrupted data is being read from the FIFO component and used.

Cover properties may be used to describe various conditions of different features of a design under test. As noted in the example above, a FIFO component may be evaluated using a cover property. Other cover properties may be used to evaluate other features, such as various other components associated with the inputs and outputs of the design under test. Cover properties may evaluate for various conditions of these components (e.g., full, empty, set, not set, idle, etc.). In various embodiments, techniques of extending cover properties in formal verification to generate failure traces that reach end-of-test may be implemented which increase the observability of bugs for different coverage events corresponding to different cover properties. In this way, the bug detection capabilities of formal verification systems can be extended.

FIG. 1 illustrates a logical block diagram of extending cover properties in formal verification to generate failure traces that reach end-of-test, according to some embodiments. A formal verification system such as system verification application 210 discussed below with regard to FIG. 2, may perform formal verification techniques using a formal verification task 110 on a hardware design described according to a hardware language (e.g., such as hardware description languages like VHDL, Verilog, and RHDL, among others). For example, a language-specified hardware design may be associated with and tested by formal verification task 110. A design under test (sometimes referred to as a DUT) may include various features or components to perform various operations, which may result in operations including providing output.

Formal verification task 110 may specify various assertions for performing verification on a design under test. As discussed above, a coverage event may be a sub-space of model states space for the design under test, which may be related to areas of the design under test that control some functionality. To incorporate coverage events as part of formal verification task 110, formal verification task 110 may include statements that assert cover properties, like cover property 120. A cover property 120 may have a condition, such as first condition 122, used to assess when the coverage event occurs, such as a failure to satisfy the condition resulting in a trigger of the first condition.

As depicted in FIG. 1, if cover property 120 were only to include first condition 122, the window of observation for formal task performance 130 may occur, as indicated at 142, until the first cover property condition is triggered, as indicated at 140. However, as discussed in above, this observation window may be insufficient to trace the occurrence of a failure which may not yet be visible (e.g., data that is within one or more components of the design under test but not yet visible as erroneous on the available outputs). Thus, in various embodiments, cover property 120 may be extended to include one or more additional condition(s) 124. These additional condition(s) 124 may cause formal verification task performance 130 to continue beyond first cover property condition trigger 140 until effective end-of-test stage 150 is reached. An effective end-of-test stage 150 may correspond to a state of the design under test which may provide a maximal observability of failures within the design under test. For example, in one example embodiment, an effective end-of-test stage may be when no additional output from the design under test is expected (e.g., all of the egress events have completed corresponding to given data input at an ingress to the design under test). In this way, expanded observation window for failure trace 152 may be provided, giving users the ability to view results, such as trace results that can identify bugs or other problems in the design under test that would remain hidden but for the expanded observation window 152.

Different techniques may be implemented for extending cover properties, as discussed in detail below with regard to FIGS. 3-7. For example, some techniques may modify the instructions in the formal verification task itself, as discussed below with regard to FIG. 4 or add a component to the design under test to extend cover properties, as discussed below with regard to FIG. 3. Some embodiments may include techniques to add multiple additional conditions in a cover property in order to provide different reporting events for a design under test before reaching the effective end-of-test stage. Some embodiments may also halt ingress of additional data, as discussed below with regard to FIG. 5, to prevent further interference with failure tracing.

Please note that the previous description of a formal verification task and task formal verification execution is merely provided as a logical example. Different numbers of components or configuration of components may be implemented.

This specification continues with a general description of a system verification application, which may implement extending cover properties in formal verification to generate failure traces that reach end-of-test. Various examples of different components/modules, or arrangements of components/modules that may be implemented in the system verification application may then be discussed. A number of different methods and techniques to implement extending cover properties in formal verification to generate failure traces that reach end-of-test are then discussed, some of which are illustrated in the accompanying flowchart. Various examples are provided throughout the specification.

Figure 2:
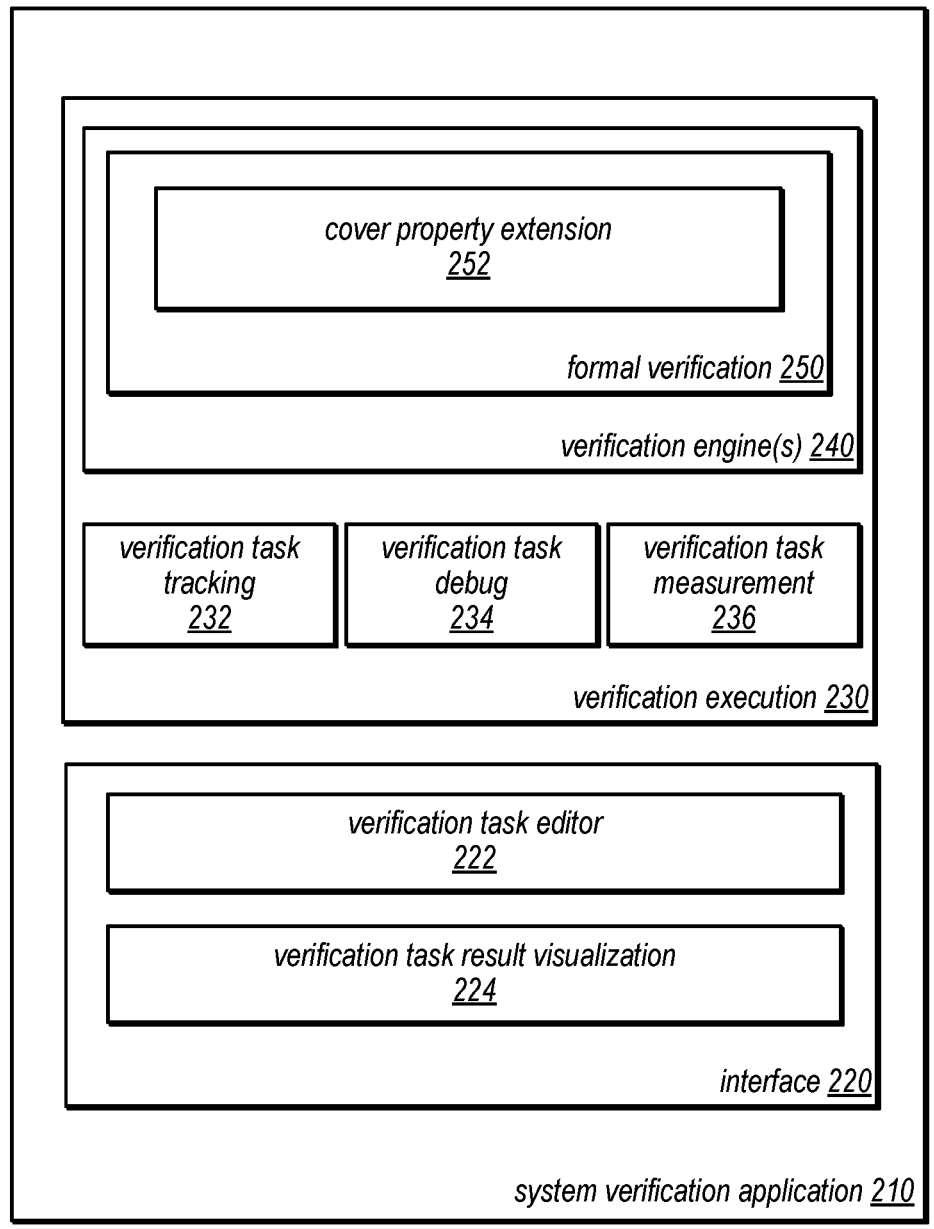
FIG. 2 is a logical block diagram illustrating a system verification application that may implement extending cover properties in formal verification to generate failure traces that reach end-of-test using formal verification, according to some embodiments.

FIG. 2 is a logical block diagram illustrating a system verification application that may implement extending cover properties in formal verification to generate failure traces that reach end-of-test using formal verification, according to some embodiments. System verification application 210 may provide a set of verification tools or functions (or may be implemented as part of a larger Integrated Development Environment (IDE)) to perform, among other operations, the development and verification of hardware designs via various verification engine(s) 250 to determine a language-specified hardware design. System verification application 210 may implement various features, such as interface 220 and verification execution 230, which may be used to perform various interactive compilation techniques.

For example, interface 220 may be a programmatic interface implementing one or multiple Application Programming Interfaces (APIs) to invoke different operations, including compilation, a GUI interface that provides various visual control elements for editing, compiling, or other development activities, and/or a command line interface, which may also provide command line controls to edit, compile, or perform other development, design, and/or verification activities. In some embodiments, interface 220 may act as a control console that allows for the configuration of system verification application 210 features. For instance, interface 220 may support requests to configure various parameters or options of verification execution 230 (or verification engine(s) 240), such as the hardware language, assertions, assumptions, cover features, or other criteria or information for performing various verification techniques, such as for formal verification 250. Like FIG. 4 below, interface 220 may provide input support for editing verification tasks, (including code, scripts, or visual objects that represent the operations of a verification task performed by one of verification engine(s) 240). For example, interface 220 may implement verification task editor 222, which may allow a user to specify various features, criteria, or parameters for different types of verification tasks implemented by different verification engine(s) 240.

Interface 220 may also implement verification task result visualization 224. Different kinds of verifications, supported by verification engine(s) 240, may result in different types of visualizations for the verification task results. For example, paths through a logical block diagrams may be illustrated to identify a path in a hardware design that traces an error, or state tables may indicate when erroneous or invalid states are achieved by a hardware design. In at least some embodiments, verification task result visualization 224 may support indicating cover properties that have been or may be extended using cover property extension 252.

System verification application 210 may implement verification execution 230, which may support a common feature set (in addition to interface 220) across multiple different types of verifications supported by different verification engines. For instance, verification task tracking 232 may provide a common interface for identifying verification task milestones, estimates, or other tracking features. Verification task debug 234 may implement various debug tools for tracing errors, identifying alternatives or errors proactively (e.g., prior to test), as well as different linking errors in visualizations to error definitions for different verification engine 240 operations, in some embodiments. In some embodiments, verification task measurement 236 may provide performance metrics, benchmarks, or other assessments of hardware designs under verification. As noted above, different types of verification techniques are supported by verification engines 240. For example, verification engine(s) 240 may provide for formal verification 250 and static verification, design simulation verification, design emulation verification, and hardware prototyping (e.g., for FPGAs), among other verification engine(s) 240. As discussed in detail above with regard to FIG. 1 and below with regard to FIGS. 3-7, cover property extension 252 may be implemented to extend failure traces for coverage events to an effective end-of-test stage of a design under test using formal verification 250.

In various embodiments, the components illustrated in FIG. 2 may be implemented directly within computer hardware, as instructions directly or indirectly executable by computer hardware (e.g., a microprocessor or computer system), or using a combination of these techniques. For example, the components of FIG. 2 may be implemented by a system that includes a number of computing nodes (or simply, nodes) as part of a service, each of which may be similar to the computer system embodiment illustrated in FIG. 8 and described below, in one embodiment. In various embodiments, the functionality of a given system or service component (e.g., a component of system verification application 210) may be implemented by a particular node or may be distributed across several nodes). In some embodiments, a given node may implement the functionality of more than one service system component (e.g., more than one development application component).

Figure 3:
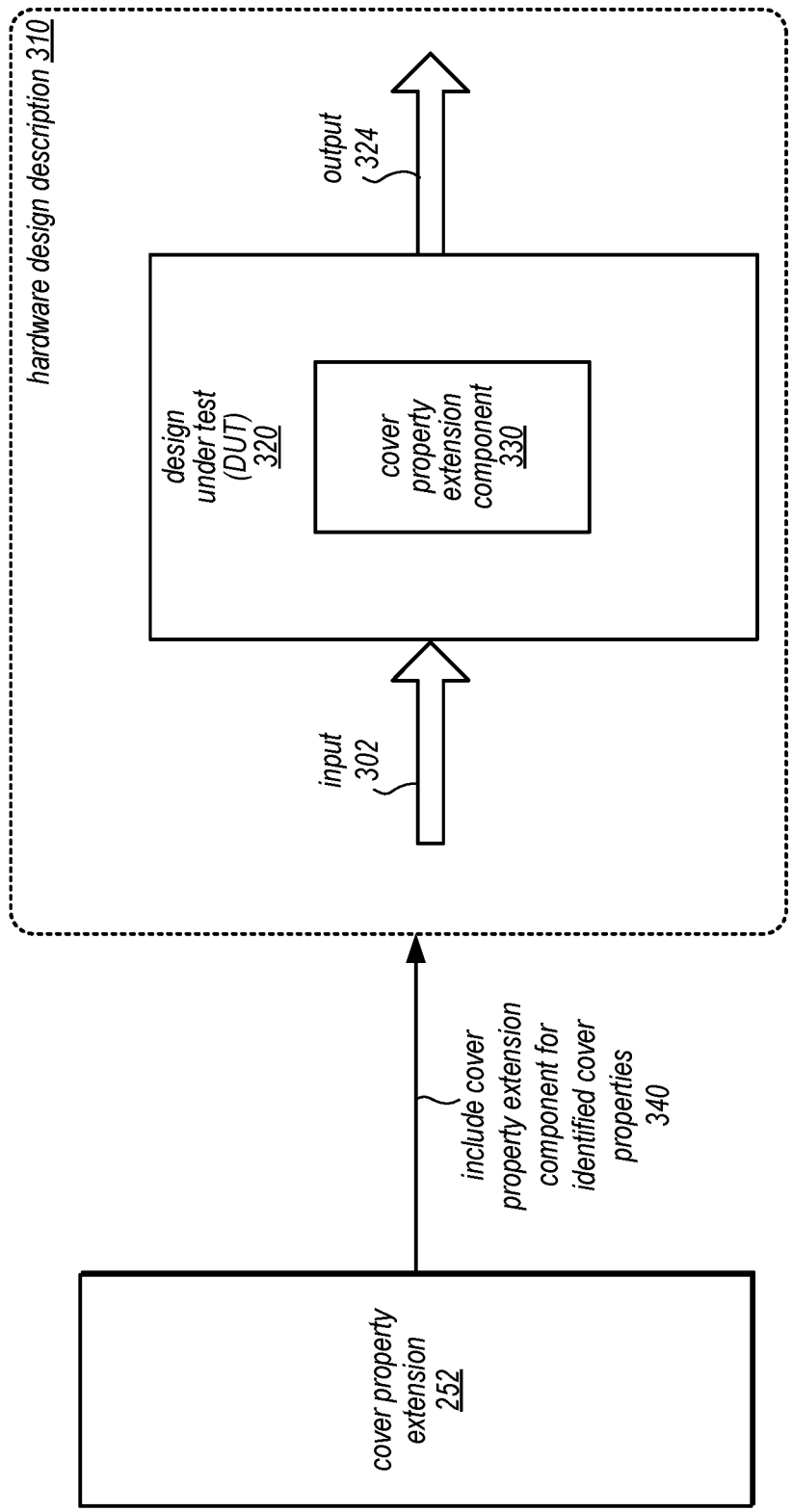
FIG. 3 is a logical block diagram illustrating an update to a hardware design description to include a cover property extension component, according to some embodiments.

Cover property extension 252 may implement various techniques to extend cover properties (or indicate cover properties to be extended), as discussed below with regard to FIG. 6. In one example, cover property extension may be made through a modification to a hardware design description. FIG. 3 is a logical block diagram illustrating an update to a hardware design description to include a cover property extension component, according to some embodiments.

For example, cover property extension 252 may analyze a received formal verification task, submitted through an interface to system verification application 210, as discussed above with regard to FIG. 2. The formal verification task may be searched to identify or find one (or more) cover properties corresponding to different coverage events that may be considered when performing formal verification on a corresponding design under test, such as design under test 320. Cover property 252 may modify the hardware design description 310 (e.g., a hardware description language object, such as a hardware description file) so that extensions of found cover properties may be implemented within the design under test itself, as a cover property extension component 330.

Consider design under test 310, which may receive input data 302 and provide output data 324 as a result of performing various operations on the input 302. The functionality covered by a found cover property may be modified by the inclusion of cover property extension component 330 which may extend the performance of formal verification until an end-of-test stage is reached. For instance, if design under test 320 is a FIFO component, then cover property extension component 330 may be a counter that indicates the number of data items in the FIFO component. An effective end-of-test stage may be reached when the counter reaches "0". The formal verification task may not end, even if a trigger for a first cover property condition occurs, because the counter has not yet reached "0". This may be enforced as an additional condition of the cover property. In this way, a trace of the may continue until the effective end-of-test stage is reached as enforced by the counter.

Figure 4:
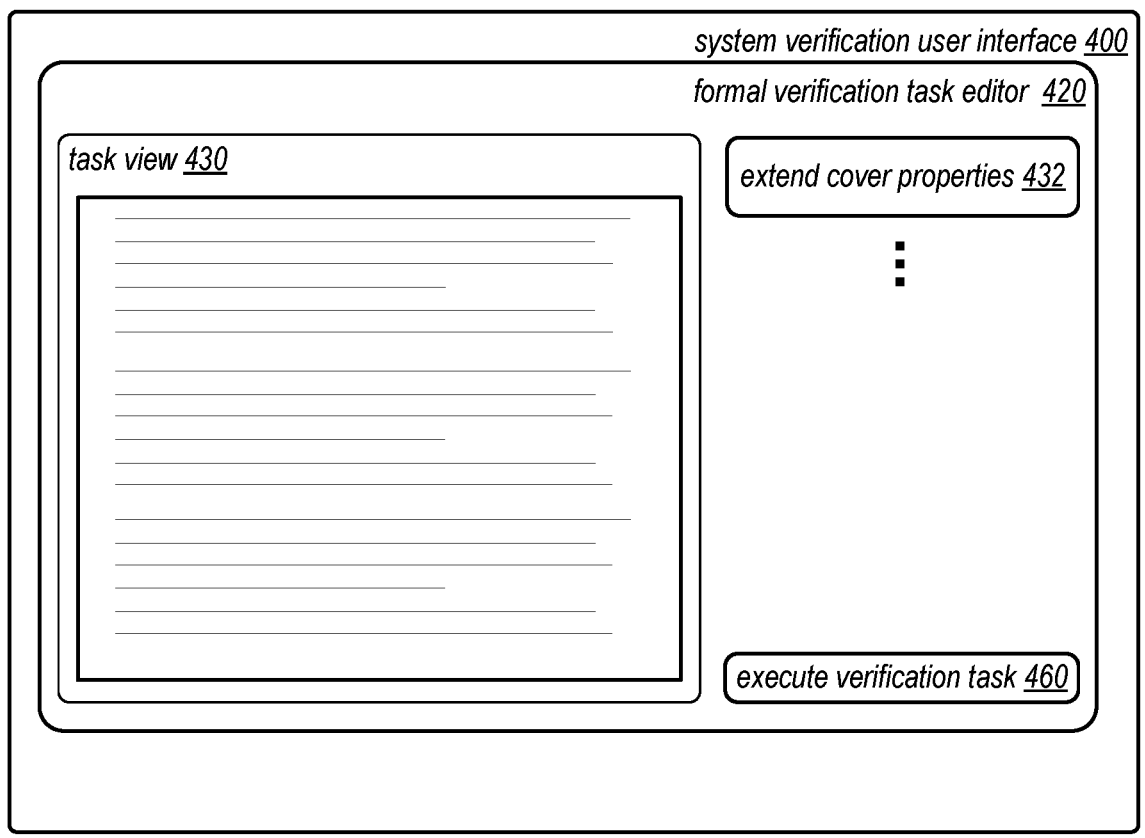
FIG. 4 is an example of an interface for requesting extensions of cover properties identified in a formal verification task, according to some embodiments.

Other techniques for extending cover properties may include modifying a description of the cover property itself such that the additional conditions are included in the cover property statement. FIG. 4 is an example of an interface for requesting extensions of cover properties identified in a formal verification task, according to some embodiments. System verification user interface 400 may be a graphical user interface implemented as part of interface 220 (e.g., as part of verification task editor 222), in some embodiments, to provide various different interface elements for creating, modifying, and/or executing a verification task that implements configuration space testing for design correctness using formal verification. For example, formal verification task editor 420 may implement various menus, buttons, lists, drop-down boxes, selectors, text, inputs, upload mechanisms, and/or other graphical user interface elements to allow a user to create a formal verification task that can, for instance, use cover properties, in some embodiments.

Formal verification task editor 420 may implement elements (not illustrated) to create or otherwise begin to specify a verification task. For instance, various templates or other verification task creation workflows may be presented. In some embodiments, various task optimization features may be selectable to be used to improve the execution of a formal verification task. For example, extend cover properties feature 432 may be selected, causing a search for cover properties and extension of cover properties found in the formal verification task. A hardware design, specified according to a hardware language may be uploaded, written or created (e.g. as part of a text editor for creating hardware designs—not illustrated). In some embodiments, cover properties may be highlighted in task view 430 with suggestions for extending the cover properties (e.g., suggestions of additional conditions to add by a user via formal verification task editor) or may be highlighted to show automatically included extensions (e.g., additional conditions) for the found cover properties.

As indicated at 460, a user interface element may be implemented to cause the execution of the verification task that utilizes extended cover properties. For example, the execution of the verification task may be performed to instantiate or otherwise create a design under test and begin formal verification using the assumptions and assertions, including assertions of extended cover properties.

Extending cover properties may increase the observability of problems in a design under test. However, extending the period of time that the design under test is tested may allow for additional data input into the design at an ingress of the design under test to potentially obscure some of the bugs that would be given time to be flushed or otherwise exposed in a failure trace to the end-of-test stage. Therefore, in some embodiments, it may be desirable to deterministically control the data driven to ingress (if any) when a first condition of a cover property is triggered, while still allowing the egress of outputs produced by the design under test, as discussed in detail below with regard to FIG. 7.

Figure 5:
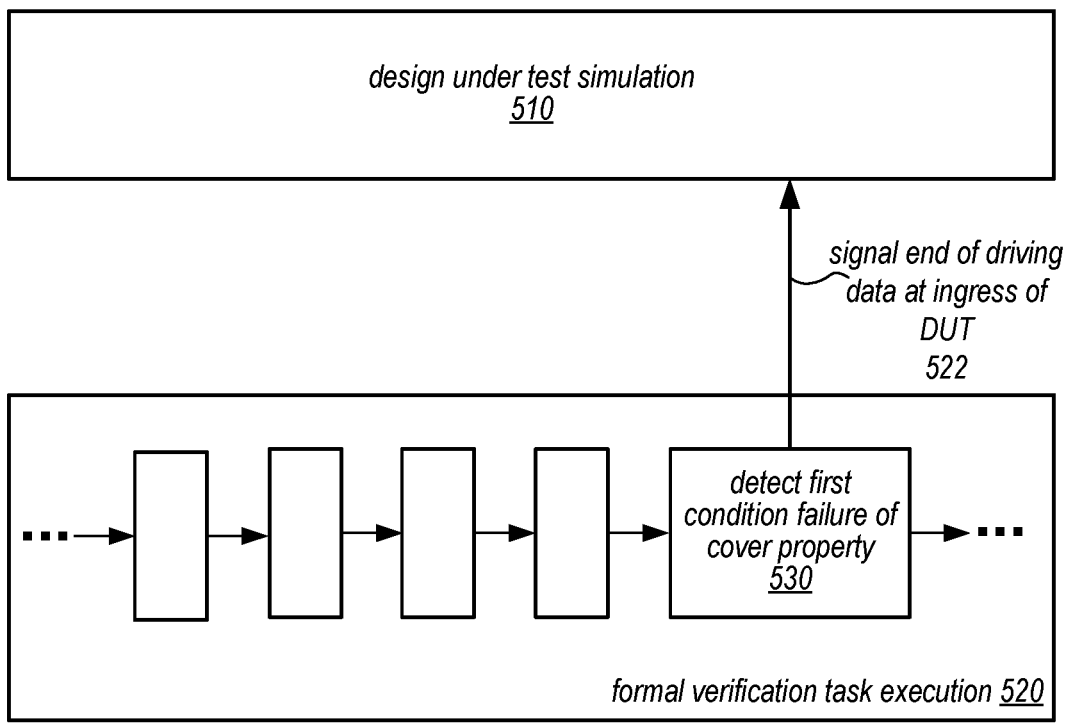
FIG. 5 is a logical block diagram illustrating a signal to end accepting data at ingress of a design under test after a first cover hit of a cover property, according to some embodiments.

For example, in some embodiments, the formal verification task may be modified to include instructions to halt or otherwise stop the ingress of additional data when a first cover property condition is triggered by stopping the driving of additional data to the design under test. In some embodiments, a simulation of the design under test may be modified. FIG. 5 is a logical block diagram illustrating a signal to stop driving data to an ingress of a design under test after a first cover hit of a cover property, according to some embodiments.

For example, in FIG. 5, an ongoing formal verification task execution 520 is proceeding through various stages when, as indicated at 530, a first cover hit of a cover property is detected. Instead of modifying the instructions in the formal verification task itself, system verification application 210 may implement a feature to automatically disable ingress of additional data as part of the design under test simulation 510, as indicated at 522. For example, the simulation executed or performed by system verification application 210 may accept signal 522 as an interrupt or other indication of an ingress blocking event, but still allow the simulation to continue until the effective end-of-test stage is reached. This feature may be integrated as part of handling extended cover properties identified (or created by system verification application 210) in a formal verification task.

The examples discussed above with regard to FIGS. 1-5 have been given in regard to an example system verification application. Note that various other types or configurations of applications, including hardware development applications, may implement extending cover properties in formal verification to generate failure traces that reach end-of-test and thus may implement these techniques. In addition to the examples given above, the techniques discussed below with regard to FIGS. 6 and 7 may be also implemented using the various components discussed above as well as different types of systems or devices that perform formal verification on a hardware design.

Figure 6:
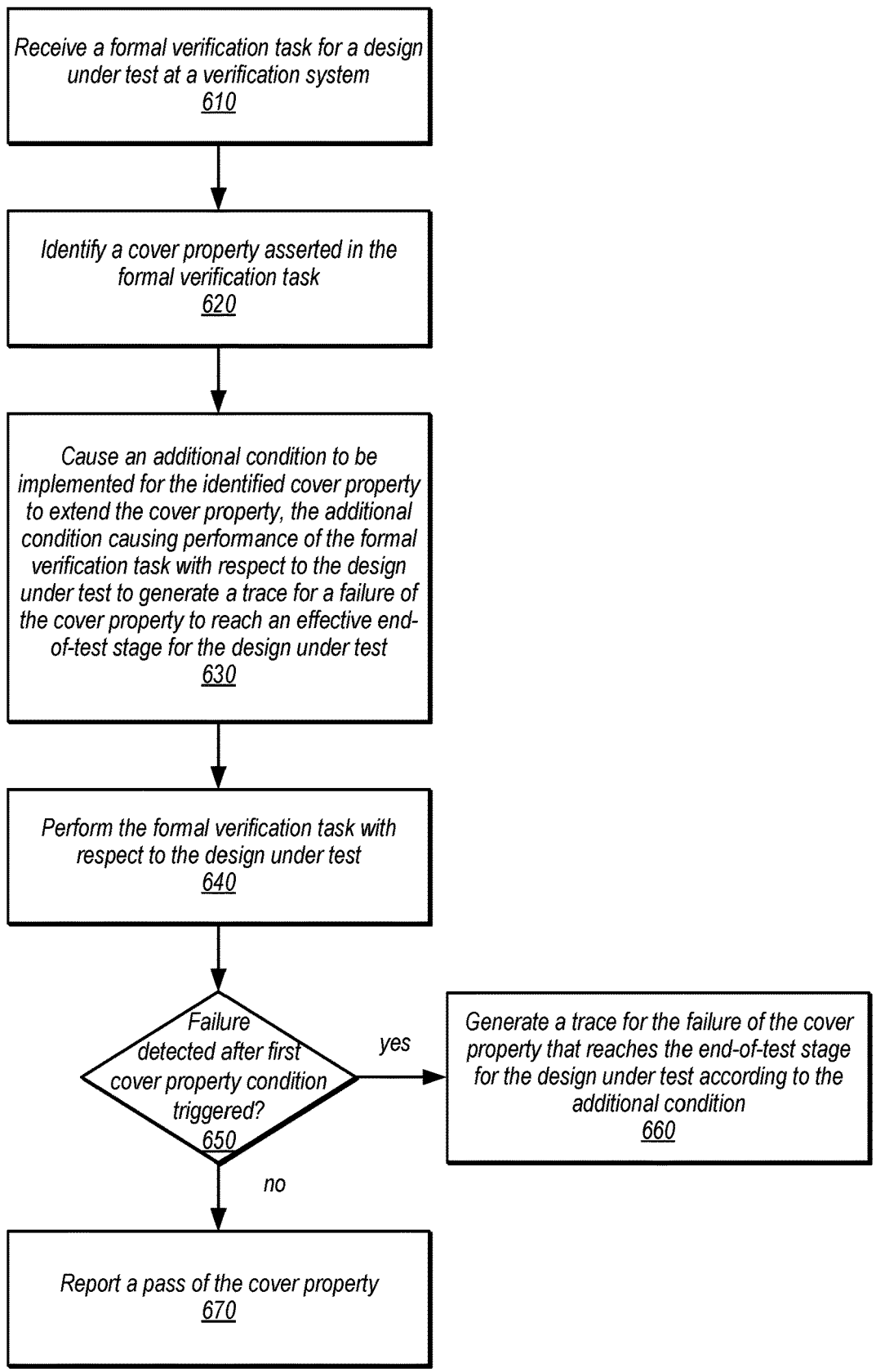
FIG. 6 is a high-level flowchart illustrating various methods and techniques to implement extending cover properties in formal verification to generate failure traces that reach end-of-test, according to some embodiments.

FIG. 6 is a high-level flowchart illustrating various methods and techniques to implement extending cover properties in formal verification to generate failure traces that reach end-of-test, according to some embodiments. A language-specified hardware design may be received, in various embodiments. For example, the hardware design may be specified according to a hardware language like System Verilog or VHSIC Hardware Definition Language (VHDL). The language-specified hardware design may be stored in a file, data object, data structure, or other portion of data that supports storing a language-specified hardware design, in some embodiments. In various embodiments, a verification system may accept as a single verification task, job, or operation, the hardware design as part of a request to create, execute, initiate, or otherwise perform formal verification on the hardware design.

As indicated at 610, a formal verification task may be received for the design under test at the verification system, in some embodiments. The formal verification task may be received via various types of interfaces (e.g., programmatic interfaces to upload a task file) or user interfaces, such as command line, text editors, or graphical user interfaces that allow a user to enter the formal verification task. A formal verification task may be specified according to a script or other human-readable programming language, supported by the verification system that includes various assumptions and assertion statements, including statements of cover properties.

As indicated at 620, a cover property may be identified in the formal verification task, in some embodiments. In some embodiments, cover properties may be identified in the formal verification task by search for key words, letters, phrases, symbols (or some combination of the preceding), such as "cover property ( )". In some embodiments, cover properties may be identified automatically upon receipt of the formal verification task. In some embodiments, a request to perform cover property extension may be received that causes the identification of cover properties and their extension, as discussed below. In some embodiments, cover property extension may be automatically performed when the formal verification task is received.

As indicated at 630, an additional condition may be caused to be implemented for the identified cover property to extend the cover property, in various embodiments. The additional condition may cause performance of the formal verification task with respect to the design under test to generate a trace for a failure of the design under test to reach an effective end-of-test stage for the design under test, in some embodiments. For example, one or more additional conditions may ensure that the end-of-stage is reached by specifying conditions that occur when end-of-stage occurs (e.g., fully flushed design components).

As discussed earlier, different techniques for implementing additional conditions may be used. The text of the formal verification task itself, for instance, may be modified in some embodiments. For example, if a cover property initially stated "cover property (condition_1)" is found, then the cover property statement may be modified to state "cover property (condition_1, condition_2)". Component implementations of additional conditions may be implemented in the design under test, in some embodiments, as discussed above with regard to FIG. 3.

As indicated at 640, the formal verification task may be performed with respect to the design under test, in some embodiments. A result of the formal verification task may be generated, such as a text, graphical, or various other result display. Although not illustrated, in some embodiments, formal verification may not complete (or completes with errors or other indications) if the cover property is never triggered (e.g., if all of the conditions, including the first condition are not satisfied).

As discussed above, triggering of the first condition of the cover property may not stop formal verification of the design under test from reaching an effective end-of-test stage. In this way if a failure were to occur after the first condition of the cover property is triggered, the additional condition(s) would ensure that the failure could be included in a trace to the effective end-of-test stage, as indicated by the negative exit from 650. For example, as indicated at 660, a trace of a failure of the design under test may be generated that reaches the effective end-of-test stage for the design under test may be generated (e.g., showing the path between various components or features of the design under test that produced the failure). As indicated at 670, if a failure of the extended cover property did not occur, then a pass may be reported as part of the result. Although not illustrated, in some scenarios, the end-of-test may not have been reached and the failure have not occurred. In this case, further analysis of the design under test may be performed to understand why neither outcome occurs.

To prevent interference with extended analysis caused by extended cover properties, deterministic input to the design under test may be given after a first condition of the cover property is triggered. For example, certain patterns, values, or frequency of data may be driven to the ingress of the design under test. In this way, interference caused by certain input (or any input at all may be avoided).

Figure 7:
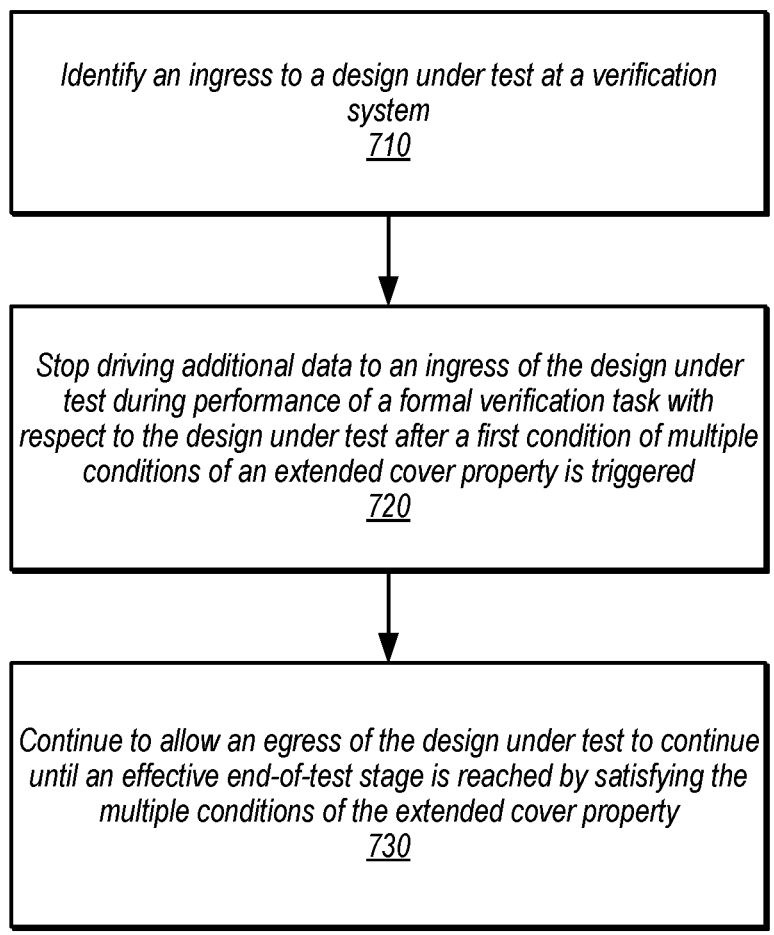
FIG. 7 is a high-level flowchart illustrating various methods and techniques to implement blocking ingress at a design under test after a first cover hit of a cover property, according to some embodiments.

FIG. 7 is a high-level flowchart illustrating various methods and techniques to implement blocking ingress at a design under test after a first cover hit of a cover property that provides one example of a technique to prevent interference with the extended analysis caused by extended cover properties. For example, as indicated at 710, an ingress to a design under test may be identified, such as the one (or more) components that accept data values as inputs to process the data and produce one or more output data values, as specified in the hardware description language used to specify the design under test.

As indicated at 720, driving of additional data to the ingress of the design under test may be stopped during remaining performance of a formal verification task with respect to the design under test after a first condition of multiple conditions of an extended cover property is triggered, in some embodiments. For example, as discussed above with regard to FIG. 5, ingress blocking may be a feature that is integrated into a verification system that detects when extended cover property conditions fail and modifies a simulation of the design under test. In some embodiments, a verification system may modify the implementation of the formal verification task, similar to modifications made to extend cover properties to include instructions that trigger ingress blocking when the first cover hit occurs. As indicated at 730, egress of the design under test may continue to be allowed until the effective end-of-test stage is reached by satisfying the multiple conditions of the extended cover property, in various embodiments.

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

Figure 8:
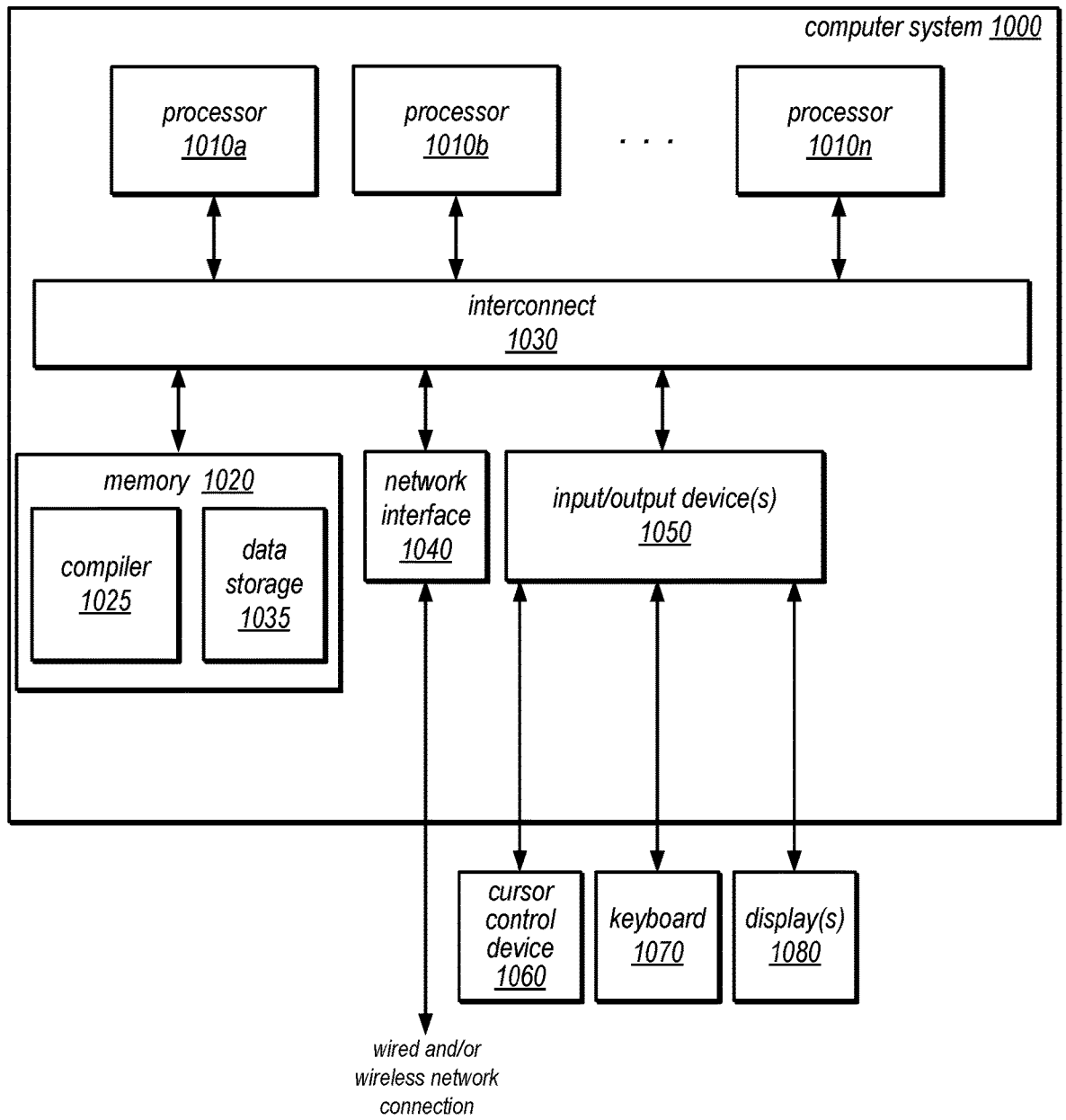
FIG. 8 is an example computer system, according to some embodiments.

Embodiments of extending cover properties in formal verification to generate failure traces that reach end-of-test as discussed above may be implemented as part of a computer system. One such computer system is illustrated by FIG. 8. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node, compute node, computing device, compute device, or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions, such as program instructions to implement a compiler 1025 (like compiler 240 discussed above with regard to FIG. 2 as well as other features or all of development application 210) and data storage 1035, respectively. In other embodiments, program instructions and/or data may be received, sent or stored upon different types of computer-accessible media or on similar media separate from system memory 1020 or computer system 1000. Generally speaking, a non-transitory, computer-readable storage medium may include storage media or memory media such as magnetic or optical media, e.g., disk or CD/DVD-ROM coupled to computer system 1000 via I/O interface 1030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

Those skilled in the art will appreciate that computer system 1000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
a processor;
a memory, storing program instructions that when executed by the processor, cause the processor to implement a verification system, the verification system configured to:
    receive a formal verification task for a design under test;
    search within the formal verification task to identify a cover property asserted in the formal verification task;
    cause an additional condition to be implemented for the identified cover property to extend the cover property, wherein the additional condition in the extended cover property causes a performance of the formal verification task with respect to the design under test to generate a trace for a failure of the design under test to reach an effective end-of-test stage for the design under test, wherein the effective end-of-test stage occurs when egress events are completed for the design under test; and
    generate a result of the performance of the formal verification task with respect to the design under test.

2. The system of claim 1, wherein the design under test failure was detected during the performance of the formal verification task with respect to the design under test after a first condition in the extended cover property was triggered, and wherein to generate the result of the performance, the verification system is configured to generate the trace for the failure of the design under test that reaches the effective end-of-test stage.

3. The system of claim 1, wherein the verification system is further configured to stop driving additional data to an ingress of the design under test during the performance of the formal verification task with respect to the design under test after a first condition of the extended cover property is triggered.

4. The system of claim 1, wherein the verification system is further configured to receive a request, via an interface of the verification system, that causes the search that identifies the cover property asserted in the formal verification task and the additional condition to be implemented for the identified cover property to extend the cover property.

5. A method, comprising:
receiving a formal verification task for a design under test at a verification system;
identifying, by the verification system, a cover property asserted in the formal verification task;
causing, by the verification system, an additional condition to be implemented for the identified cover property to extend the cover property, wherein the additional condition in the extended cover property causes a performance of the formal verification task with respect to the design under test to generate a trace for a failure of the design under test to reach an effective end-of-test stage for the design under test; and
performing, by the verification system, the formal verification task with respect to the design under test.

6. The method of claim 5, further comprising generating a result of the performance of the formal verification task with respect to the design under test.

7. The method of claim 6, wherein the design under test failed during the performance of the formal verification task with respect to the design under test after a first condition in the extended cover property was triggered, and wherein generating the result of the performance comprises generating the trace for the failure of the design under test that reaches the effective end-of-test stage.

8. The method of claim 6, wherein the result of the performance of the formal verification task with respect to the design under test comprises a pass for the extended cover property.

9. The method of claim 5, wherein causing the additional condition to be implemented for the identified cover property to extend the cover property comprises including an additional component in the design under test to implement the additional condition to extend the cover property.

10. The method of claim 5, further comprising stopping, by the verification system, driving of additional data to an ingress of the design under test during the performance of the formal verification task with respect to the design under test after a first condition of the extended cover property is triggered.

11. The method of claim 10, wherein stopping the driving of the additional data to the ingress of the design under test comprises modifying a simulation of the design under test.

12. The method of claim 5, wherein a further condition is also implemented for the cover property to further extend the cover property as part of extending the cover property.

13. The method of claim 5, further comprising receiving a request via an interface of the verification system that causes the identification of the cover property asserted in the formal verification task and the additional condition to be implemented for the identified cover property to extend the cover property.

14. One or more non-transitory, computer-readable storage media, storing program instructions that when executed on or across one or more computing devices cause the one or more computing devices to implement:
    receiving a formal verification task for a design under test at a verification system;
    searching within the formal verification task to identify a cover property asserted in the formal verification task;
    causing an additional condition to be implemented for the identified cover property to extend the cover property, wherein the additional condition in the extended cover property causes a performance of the formal verification task with respect to the design under test to generate a trace for a failure of the design under test to reach an effective end-of-test stage for the design under test; and performing the formal verification task with respect to the design under test.

15. The one or more non-transitory, computer-readable storage media of claim 14, wherein the design under test failed during the performance of the formal verification task with respect to the design under test after at first condition of the extended cover property is triggered and wherein the program instructions further cause the one or more computing devices to implement generating the trace for the failure of the design under test that reaches the effective end-of-test stage.

16. The one or more non-transitory, computer-readable storage media of claim 14, wherein, in causing the additional condition to be implemented for the identified cover property to extend the cover property, the program instructions cause the one or more computing devices to implement the additional condition in a statement of the cover property in the formal verification task.

17. The one or more non-transitory, computer-readable storage media of claim 14, storing further instructions that cause the one or more computing devices to further implement driving a deterministic input to an ingress of the design under test during the performance of the formal verification task with respect to the design under test after a first condition of the extended cover property is triggered.

18. The one or more non-transitory, computer-readable storage media of claim 17, wherein, in driving the deterministic input to the ingress of the design under, the program instructions cause the one or more computing devices to implement modifying the formal verification task.

19. The one or more non-transitory, computer-readable storage media of claim 14, storing further instructions that cause the one or more computing devices to further implement generating a result of the performance of the formal verification task with respect to the design under test that comprises a pass for the design under test after the additional condition is triggered.

20. The one or more non-transitory, computer-readable storage media of claim 14, storing further instructions that cause the one or more computing devices to further implement receiving a request via an interface of the verification system that causes the search that identifies the cover property asserted in the formal verification task and the additional condition to be implemented for the identified cover property to extend the cover property.

\* \* \* \* \*